United States Patent [19]

Premerlani

[11] Patent Number: 4,723,216
[45] Date of Patent: Feb. 2, 1988

[54] DIGITAL FREQUENCY-LOCKED LOOP FOR USE WITH STAGGERED SAMPLING SYSTEMS

[75] Inventor: William J. Premerlani, Scotia, N.Y.

[73] Assignee: General Electric Company, Schenectady, N.Y.

[21] Appl. No.: 761,267

[22] Filed: Aug. 1, 1985

[51] Int. Cl.⁴ ............................................. H03C 5/00
[52] U.S. Cl. .................................... 364/484; 375/81; 375/120; 455/260
[58] Field of Search ........... 364/484; 324/78 D, 78 R, 324/78 F, 79 R, 79 D; 455/260, 183; 375/81, 120

[56] References Cited

U.S. PATENT DOCUMENTS 3,978,407  8/1976  Forney, Jr. et al. ................ 375/15
4,485,358 11/1984  Andren et al. ..................... 455/102
4,509,017  4/1985  Andren et al. ..................... 455/214

OTHER PUBLICATIONS

IEEE Transactions on Acoustics, Speech and Signal Processing, vol. ASSP-23, No. 2, Apr. 1975-"Rapid Measurement of Digital Instantaneous Frequency", pp. 207-222.
Patent Application-GE Docket RD-14326-"An Improved Digital Phase-Locked Loop and Frequency Measuring Device", W. J. Premerlani, Filed Aug. 6, 1985, S.N. 762,992.
B.S.T.J. Brief-"Least-Squares Estimator for Frequency Shift Position Modulation in White Noise" by V. E. Benes-Sep. 1980-pp. 1289-1296.
The Bell System Tech. Journal-"Spectral Moment Estimators: A New Approch to Tone Detection" by J. N. Denenberg, Feb. 1976-pp. 143-155.
IEEE Transactions on Communications, vol. COM-24, No. 10, "Algorithmic Measurement of Digital Instantaneous Frequency", pp. 1115-1121.

*Primary Examiner*—Errol A. Krass
*Assistant Examiner*—V. N. Trans
*Attorney, Agent, or Firm*—Richard V. Burgujian; James C. Davis, Jr.; Paul R. Webb, II

[57] ABSTRACT

A digital frequency locked loop is disclosed for use with programmable signal processing apparatus wherein frequency locking is desired from staggered data samples. Sampling means are provided for sampling an input signal, at instants determined by the sampling signal, to provide N data signals from M cycles of the input signal wherein each data signal represents the magnitude of the input signal at the sampling instant. Signal processing means are provided for performing a unique approximation to the optimal mean square estimation analysis to provide a frequency deviation signal which is proportional to the difference in frequency between the sampling and input signals. The frequency deviation signal is used to modulate the period of the sampling signal such that the frequency of the sampling signal is maintained in constant proportion to the frequency of the input signal.

10 Claims, 5 Drawing Figures

DIGITAL FREQUENCY-LOCKED LOOP FOR USE WITH STAGGERED SAMPLING SYSTEMS

BACKGROUND OF THE INVENTION

The present invention is directed in general toward frequency-locked loops and, more particularly, toward a digital frequency locked loop implemented with programmable signal processing methods for use in systems employing staggered sampling.

There are many devices and methods available at the moment for determining frequency and for locking to an analog signal. Generally, they fall into two broad classes, to wit, analog and digital. Although analog frequency-locked loops once dominated the art, continued progress in semiconductor technology, enhancing the performance, speed, and reliability of integrated circuits while simultaneously reducing their size and cost, has resulted in strong interest in the implementation of the frequency-locked loop in the digital domain.

Aside from the obvious size and cost advantages associated with digital systems, a digital version of the frequency locked loop alleviates many other problems associated with its analog counterpart, namely: sensitivity to dc drifts and component saturations, difficulties encountered in building higher order loops, and the need for initial calibration and periodic adjustments. In addition, since many systems requiring frequency locking already employ digital signal processing devices to perform other functions, a digital frequency locked loop can make use of these processing devices eliminating the need for other specialized circuitry and further reducing circuit cost.

Notwithstanding the increasing desirability of a digital version of the frequency locked loop, existing implementations have proven inadequate for most applications. This is in large measure because conventional digital devices for locking a local signal to an analog input signal determine the frequency of the input signal by measuring the time interval between zero crossings. However, this method of measuring the input frequency is sensitive to noise which may cause the timing of the zero crossing to fluctuate and, therefore, these devices are inadequate for frequency locking. Further, this method is costly to implement because a dedicated counter is necessary to perform the zero crossing measurement. Alternatively, a digital processor may be used for this measurement, however, the processor performing the frequency measurement must either be dedicated to the measurement or must be interrupted in the performance of other tasks to measure the zero crossing time.

Further, other methods for determining the frequency of an analog input can not be adapted to systems employing staggered sampling of the input signal. This is mainly due to the effects of frequency drift between samples. Nonetheless, in many systems which perform digital processing of input signals staggered sampling is desirable. These systems further require frequency locking to maintain the integrity of the samples. Hence, a digital frequency locked loop which can be implemented using programmable processing techniques and which makes use of staggered samples can be implemented in these systems with no need for additional circuitry and thus at reduced production cost.

There exists, therefore, a need to determine the frequency of an analog signal with a high degree of accuracy and to use this information to improve both the performance and productivity of processing elements used in digital frequency locked loops. Further, there exists the need for a frequency locked loop which performs the frequency deviation calculation using staggered samples as its input.

SUMMARY OF THE INVENTION

The present invention addresses the aforementioned inadequacies of the prior art by providing a digital frequency locked loop for providing a sampling signal at a frequency which is proportional to the frequency of an input signal wherein the frequency of the input signal is determined with a high degree of accuracy and without resorting to measuring time intervals occurring between zero crossings. Further, the frequency locked loop of the subject invention performs these functions using staggered samples as its input.

An analog to digital converter is provided for receiving the analog input signal and for providing a plurality of data signals at instants determined by the frequency locked loop sampling signal. The data signals are each representative of the input voltage at the sampling instant. In accordance with the present invention, the data signals are provided in a staggered manner, i.e., N data signals are provided over M cycles.

A signal processor is provided for receiving the data signals and for performing an approximation to the optimal mean square estimation analysis on these values to provide the frequency locked sampling signal. The mean square estimation analysis, assumes an amplitude, phase angle and frequency for the input signal and uses these values to predict the values of the input signal at the sampling instants. By minimizing the sum of the squares of the errors between the predicted values and the measured values, with respect to amplitude, phase angle and frequency, a sampling signal can be provided having a frequency which is in constant proportion to the frequency of the analog input signal.

It is, therefore, an object of the present invention to provide an improved digital frequency locked loop.

It is a further object of the present invention to provide a digital frequency locked loop wherein the input signal frequency is determined with a high degree of accuracy without resorting to measuring time intervals between the zero crossings.

It is another object of the present invention to provide a digital frequency locked loop which makes use of staggered data samples to perform the phase locking func- tion.

It is a still further object of the present invention to provide a method for locking a sampling signal to an input signal which can be implemented with programmable signal processing devices already found in most data processing systems thereby eliminating the need for specialized frequency locking circuitry.

BRIEF DESCRIPTION OF THE DRAWINGS

The subject matter which is regarded as invention is particularly pointed out in the claims appended hereto. The invention, however, both as to organization and method of practice, may best be understood from a reading of the following detailed description taken in conjunction with the drawings in which:

DETAILED DESCRIPTION OF THE DRAWINGS

Figure 1:
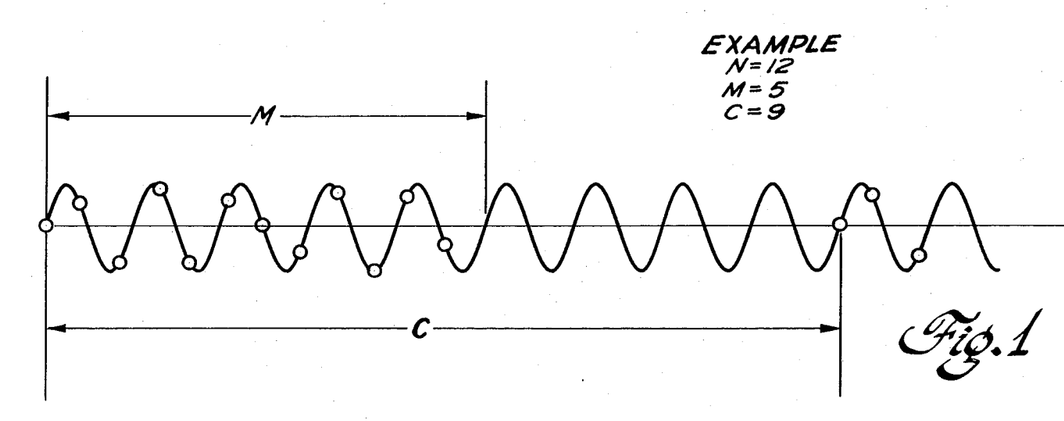
FIG. 1 is an illustration of a sinusoidal signal which further illustrates the method of staggered sampling.

The present invention comprises a digital frequency locked loop implemented using programmable signal processing devices which is adapted for use with data processing systems employing staggered sampling. As used herein, staggered sampling refers to a method of sampling an input signal wherein a plurality of data samples are taken over a plurality of cycles such that the data samples can later be rearranged to represent one cycle of the input signal. As shown in FIG. 1, N data samples are taken over M cycles such that, after being rearranged, the N samples represent one cycle of the input. Further, as shown in FIG. 1, the process is repeated every C cycles.

Figure 2:
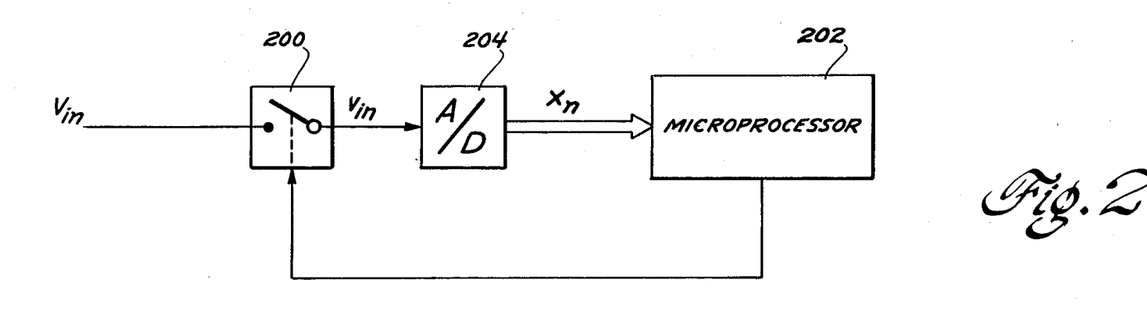
FIG. 2 is an illustrative block diagram of apparatus which comprises the subject invention.

Apparatus for sampling the input signal and for frequency locking thereto in accordance with the present invention is shown in FIG. 2. Therein, sampling means 200 is coupled to receive a sinusoidal input $V_{in}$ having the general form:

$$V_{in} = A \cos(\omega t + \phi).$$

Sampling means 200 includes a control input coupled to a microprocessor 202 for receiving a sampling signal therefrom. Sampling means 200 is responsive to the sampling signal received from microprocessor 202 for sampling its voltage input $V_{in}$ to provide an analog voltage output $v_{in}$ which is indicative of the input voltage magnitude at the sampling instant. Sampling means 200 may comprise any device, or combination of devices, for performing this function. As an example, sampling means 200 may comprise a switch relay or other similar device as is known in the art. In the preferred embodiment, sampling means 200 comprises an AD582 sample and hold amplifier available from the Analog Devices Company.

An analog-to-digital (A/D) converter 204 is coupled to receive the output $v_{in}$ from sampling means 200 and to provide therefrom a digital data value $x_n$, which data represents the magnitude of the input signal $V_{in}$ at the sampling instant. A/D converter 204 may comprise any device, or combination of devices, capable of performing the analog-to-digital conversion task. Many devices suitable for use as A/D converter 204 are known in the art. As an example, A/D converter 204 may comprise an AD571 analog to digital converter as available from the Analog Devices Company.

In an alternate embodiment, sampling means 200 and A/D converter 204 may comprise a single integrated circuit for performing both the sampling and conversion functions. As an example, sampling means 200 and A/D converter 204 may comprise an ADC0820 analog to digital converter with track and hold function available from the National Semiconductor Company.

Microprocessor 202 is coupled to receive the digital data values $x_n$ from A/D converter 204. Microprocessor 202 is adapted to implement the methods as described herein to provide a sampling signal to sampling means 200, the frequency of which is proportional to the frequency of the input signal $V_{in}$. Particularly, microprocessor 202 is adapted to perform an approximation to the optimal mean square estimation analysis on the received data to provide a frequency deviation signal which is proportional to the difference between the frequency of the sampling signal and the frequency of the input signal. The optimal mean square estimation analysis performed by microprocessor 202 assumes an amplitude A, a frequency f and a phase angle $\theta$ for the input signal. These assumed values can then be used to predict the values of the input signal at the sampling instants. By developing an expression for the sum of the squares of the errors between the sampled data and the predicted data at the sampling instant $t_n$, to wit:

$$E = \sum_{n=0}^{N-1} e_n^2 = \sum_{n=0}^{N-1} [x_n - A\cos(2\pi f t_n + \theta)]^2$$

and minimizing the expression with respect to frequency, amplitude and phase angle, i.e., approximating a solution for the simultaneous equations:

$$\frac{\delta E}{\delta A} = 0,$$

$$\frac{\delta E}{\delta \theta} = 0, \text{ and}$$

$$\frac{\delta E}{\delta f} = 0,$$

a method is provided for determining the amplitude, frequency or phase angle of the input signal from the sampled data values. Microprocessor 202 is, therefore, adapted to perform this method to determine the frequency deviation of the sampling signal from the input signal and, thereafter, modulate the sampling signal such that the frequency of the sampling signal is maintained in constant proportion to the frequency of the input signal $V_{in}$.

It will be noted that the simultaneous equations defined above cannot be solved exactly and, therefore, the method as described herein represents only an approximate solution to the optimal mean square estimation analysis. Nonetheless, it will be apparent to those skilled in the art that the method of the present invention provides a simple yet extremely accurate solution to this problem, which solution can be readily implemented via programmable signal processing techniques.

As noted above, the sampling signal provided from microprocessor 202 to sampling means 200 is adapted to provide a plurality of samples, N, equally distributed over a plurality of input signal cycles, M, such that the digital data values $x_n$ are provided to microprocessor 202 in a staggered manner, as illustrated in FIG. 1. Further, as described more fully hereinbelow, microprocessor 202 is adapted to receive samples $x_n$ every C cycles where:

$$C \geq M.$$

Thus, microprocessor 202 will receive N samples over M cycles and will be totally free to perform other functions for the remaining C-M cycles. Further, because the data samples are taken in a staggered manner, microprocessor 202 will also be free to perform other functions intermediate receipt of each sample.

Microprocessor 202 may comprise any signal processing device, or combination of devices, for performing the method as described herein. As an example, microprocessor 202 may comprise an 8051 microprocessor as available from the Intel Company.

Figure 3:
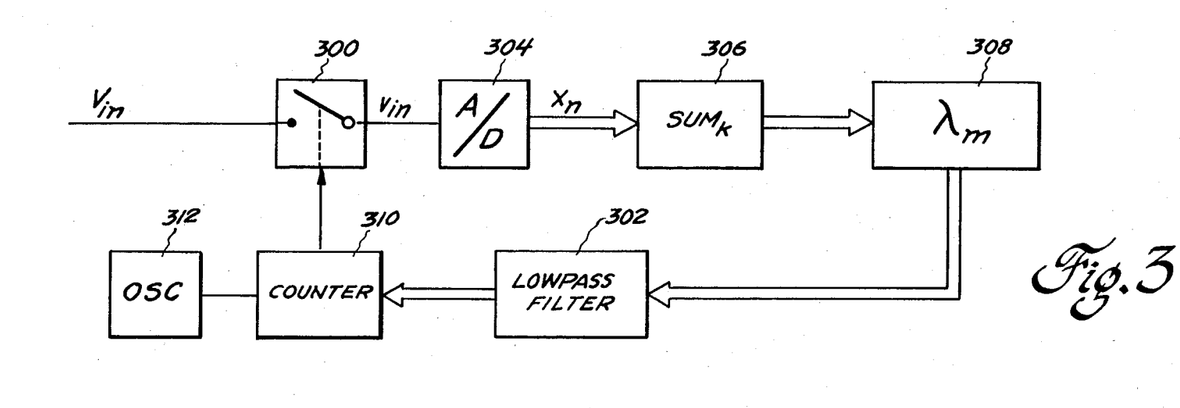
FIG. 3 is an illustrative block diagram of alternative apparatus for implementing the subject invention.

With reference to FIG. 3, there is shown an alternative embodiment for implementing the subject invention. Therein, sampling means 300 is adapted for sampling a sinusoidal input signal $V_{in}$, in response to a sampling signal received from a digital counter 310, to provide a voltage magnitude $v_{in}$ to an A/D converter 304. Sampling means 300 and A/D converter 304 operate similar to sampling means 200 and A/D converter 204 (FIG. 2) to provide a digital data signal $x_n$, which data represents the value of the input signal $V_{in}$ at the sampling instant. Therefore, sampling means 300 and A/D converter 304 may comprise devices similar to sampling means 200 and A/D converter 204 of FIG. 2.

An adder, or integrator, circuit 306 is coupled for receiving the digital data values $x_n$ from A/D converter 304 and for providing a plurality of weighted sums from the N data samples. Particularly, adder circuit 306 provides four sum values in accordance with the following mathematical expressions:

$$SUM_1 = \sum_{n=0}^{N-1} a_n x_n,$$

$$SUM_2 = \sum_{n=0}^{N-1} b_n x_n,$$

$$SUM_3 = \sum_{n=0}^{N-1} c_n x_n,$$

$$SUM_4 = \sum_{n=0}^{N-1} d_n x_n,$$

where the weights $a_n$, $b_n$, $c_n$ and $d_n$ are defined as follows:

$$a_n = \cos[(2\pi M/N)\cdot(n+\tfrac{1}{2}-N/2)]$$

$$b_n = \sin[(2\pi M/N)\cdot(n+\tfrac{1}{2}-N/2)]$$

$$c_n = (a_n/N)(n+\tfrac{1}{2}-N/2)$$

$$d_n = (b_n/N)(n+\tfrac{1}{2}-N/2)$$

for $n = 0, 1, 2 \ldots (N-1)$.

Adder circuitry 306 may comprise any device, or combination of devices, suitable for providing the weighted sums as described above. As an example, adder circuitry 306 may comprise a programmable logic array. As another example, adder circuitry 306 may comprise a programmable signal processing device, such as microprocessor 202 of FIG. 2.

A digital multiplication circuit 308 is coupled for receiving the weighted sums and for providing therefrom a frequency deviation signal $\lambda$ indicative of the difference between the frequency of the sampling signal and the frequency of the input signal $V_{in}$. Particularly, the frequency deviation signal is provided in accordance with the following mathematical expressions:

$$D = -SUM_1 SUM_4 + SUM_2 SUM_3 + G(SUM_2^2 - SUM_1^2),$$

$$A = SUM_1^2 + SUM_2^2, \text{ and}$$

$$\lambda = (6 \cdot D)(\pi \cdot M \cdot A),$$

wherein G is the pre-computed constant:

$$G = 1/[2N \cdot \sin(2\pi/N)],$$

and wherein $\lambda$ is the frequency deviation of the sampling signal from the input signal and A is the amplitude of the input signal. Multiplication circuit 308 may comprise any device or combination of devices for providing the frequency deviation signal $\lambda$ in response to the weighted sums. As an example, multiplication circuit 308 may comprise a programmable processing device such as microprocessor 202 of FIG. 2.

A digital lowpass filter 302 is coupled for receiving the frequency deviation signal $\lambda$ and for providing therefrom the period of the sampling signal. Particularly, filter 302 is a digital integrator adapted for filtering the frequency deviation signal $\lambda$ to alleviate the effects of noise which may accompany the input signal. To this end, filter 302 is adapted to process the frequency deviation signal in accordance with the following formula:

$$T_m = T_{m-1} - T_{nom} \lambda_m B,$$

wherein T represents the period of the sampling signal, $T_{nom}$ represents the sampling period and B represents a stability constant. It will be appreciated by those skilled in the art that by choosing B to be a high number, the loop will respond quickly but will lose stability. Conversely, by choosing B to be a small number, the loop will respond slowly but will be more stable. In the preferred embodiment, B is chosen in accordance with the following limitations:

$$0 < B \leq 1.$$

In addition to providing the filtering described above, filter 302 is adapted to provide the period of the sampling signal such that N data samples are provided over a plurality of cycles M. This will be true where the nominal period $T_{nom}$ referred to above is chosen to correspond to the staggered period for N data samples over M cycles. It will be noted that by choosing M=1, and providing a period $T_{nom}$ corresponding to N data samples over one cycle, e.g., $T_{nom} = N/f_{nom}$ ($f_{nom}$ being the nominal frequency of the input signal), then the samples will be taken in one cycle and the apparatus disclosed herein will operate from data received in a nonstaggered manner. Filter 302 is further adapted to provide the sampling period in a manner such that data samples are provided every C cycles where:

$$C \geq M$$

such that N data samples are provided over M cycles and no data samples are provided for the remaining C-M cycles, as illustrated in FIG. 1.

Filter circuitry 302 may readily be provided by one skilled in the art in accordance with the foregoing description. Accordingly, filter circuitry 302 may comprise any element, or combination of elements, adapted for performing the above recited functions.

Filter circuitry 302 is coupled to a digital counter 310 for providing the sampling period T thereto. Counter 310 is coupled to a fixed frequency oscillator 312 for counting the fixed frequency oscillating pulses provided therefrom. Counter 310 is responsive to the oscillator for counting a number of pulses corresponding to the period T received from filter 302 to measure the received sampling period. After the sampling period has been thus measured, i.e., the correct number of pulses counted, counter 310 provides a sampling signal, or pulse, to sampling means 300 such that a data sample $x_n$ will be provided.

Counter 310 and oscillator 312 may comprise any elements for performing the timing functions described above. Further, counter 310 and oscillator 312 may comprise a single integrated circuit adapted for performing the recited timing function.

It is to be noted that adder circuitry 306 in combination with multiplication circuitry 308, filter circuitry 302, counter 310 and oscillator 312 of FIG. 3 perform essentially the same function as described above with reference to microprocessor 202 of FIG. 2. Thus, by providing the weighted sums, combining these sums to provide the frequency deviation signal $\lambda$, filtering $\lambda$ and processing $\lambda$ to provide the frequency locked loop sampling signal, the above circuitry performs the subject method for approximating the optimal mean square estimation analysis to provide a sampling signal at a frequency which is in constant proportion to the input signal. As described above, the optimal mean square estimation analysis minimizes the mean square error between assumed and actual values of $x_n$, with respect to phase angle, amplitude and frequency, to provide a frequency deviation signal, $\lambda$, indicative of the difference between the sampling frequency and the frequency of the sinusoidal voltage input $V_{in}$.

Figure 4:
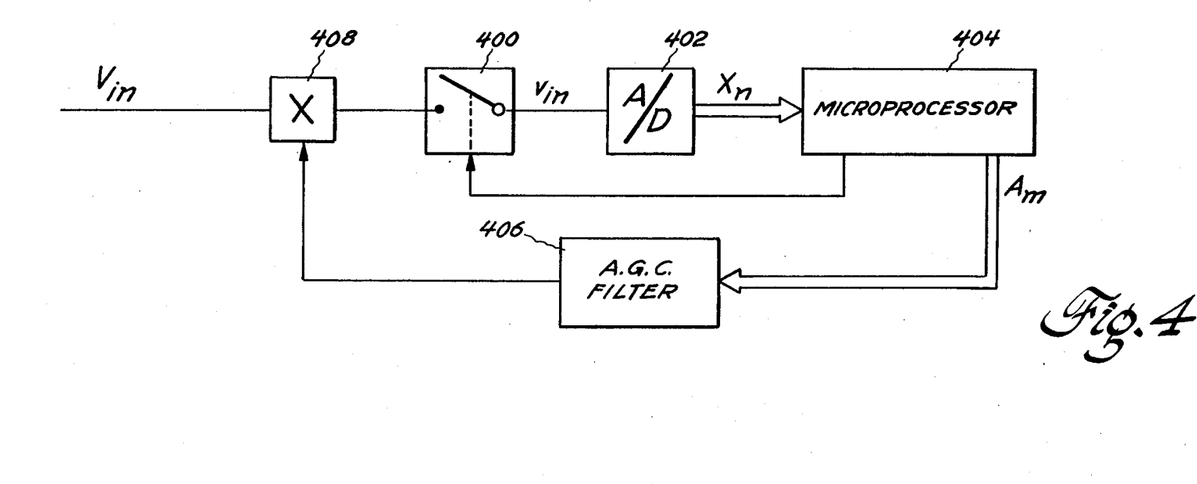
FIG. 4 is an illustrative block diagram of still another embodiment for implementing the subject invention.

A still further embodiment for implementing the method of the present invention is shown in FIG. 4 wherein sampling means 400, analog to digital converter 402, and microprocessor 404 are provided for sampling an input signal and for performing the approximation to the optimal mean square estimation analysis as described hereinabove with reference to FIG. 2. These elements, therefore, may comprise apparatus similar to the sampling means, analog to digital converter and microprocessor as described with reference to that Figure.

Referring again to FIG. 4, microprocessor 404 is shown coupled to sampling means 400 for providing a sampling signal thereto, the frequency of which is in constant proportion to the frequency of the input signal $V_{in}$ all as described above with reference to FIG. 2. Microprocessor 404 is also coupled to an automatic gain control filter 406 for providing thereto a signal $A_m$ which is indicative of the amplitude of input signal $V_{in}$. AGC filter 406 is coupled to a multiplication circuit 408 and is adapted to provide thereto a multiplication gain factor $g_m$ in response to the amplitude signal $A_m$ received from microprocessor 404, such that when multiplied by this gain factor, input voltage $V_{in}$ will be supplied to sampling means 400 with a constant peak amplitude. Thus, AGC filter 406 and multiplication means 408 perform an automatic gain control function as is known in the art in response to the amplitude signal $A_m$ received from microprocessor 404.

Automatic gain control filter 406 and multiplier 408 are provided to eliminate the need for division by the amplitude A in determining the frequency deviation signal $\lambda$, as defined above. Thus, by providing the amplitude signal $A_m$ to AGC filter 406, which amplitude was defined above as:

$$A_m = SUM_1^2 + SUM_2^2,$$

the division by the amplitude necessary in the foregoing formula for determining $\lambda$ can be eliminated such that $\lambda$ is provided in accordance with the following formula:

$$\lambda_m = (6 \cdot D)/(\pi \cdot M \cdot I),$$

wherein I is a constant value equal to the constant amplitude of the input signal as provided from multiplier 408. It will be noted that in the above formula the ratio $6/(\pi MI)$ can be precomputed as a constant, thereby eliminating any division necessary to compute the frequency deviation $\lambda$.

AGC filter 406 may comprise any device, or combination of devices, capable of performing filtering functions as described herein. Particularly, AGC filter may comprise any combination of devices capable of providing an analog filtering gain $g_m$ in response to a digital amplitude value $A_m$ in accordance with the following formula:

$$g_m = g_{m-1} - C(A_m - I),$$

wherein C is a constant chosen as follows:

$$0 < C \leq 1,$$

which constant provides a tradeoff between stability and transient response of the AGC filter. Multiplying means 408 may comprise any device, or combination of devices, capable of multiplying the input signal $V_{in}$ by the feedback gain $g_m$ to provide an output signal of constant peak amplitude.

It will be apparent to those skilled in the art that the apparatus of FIG. 4 for providing automatic gain control is but one of many possible implementations of this function. Indeed the automatic gain control function can be implemented as part of the method performed by microprocessor 404, thereby eliminating the need for external circuitry. Also, the multiplication of FIG. 4 could be performed digitally on data samples $x_n$ before being supplied to the microprocessor thereby eliminating the need for digital to analog conversion within the AGC filter. Many other possible implementations of the automatic gain control function will readily become apparent to those skilled in the art.

Figure 5:
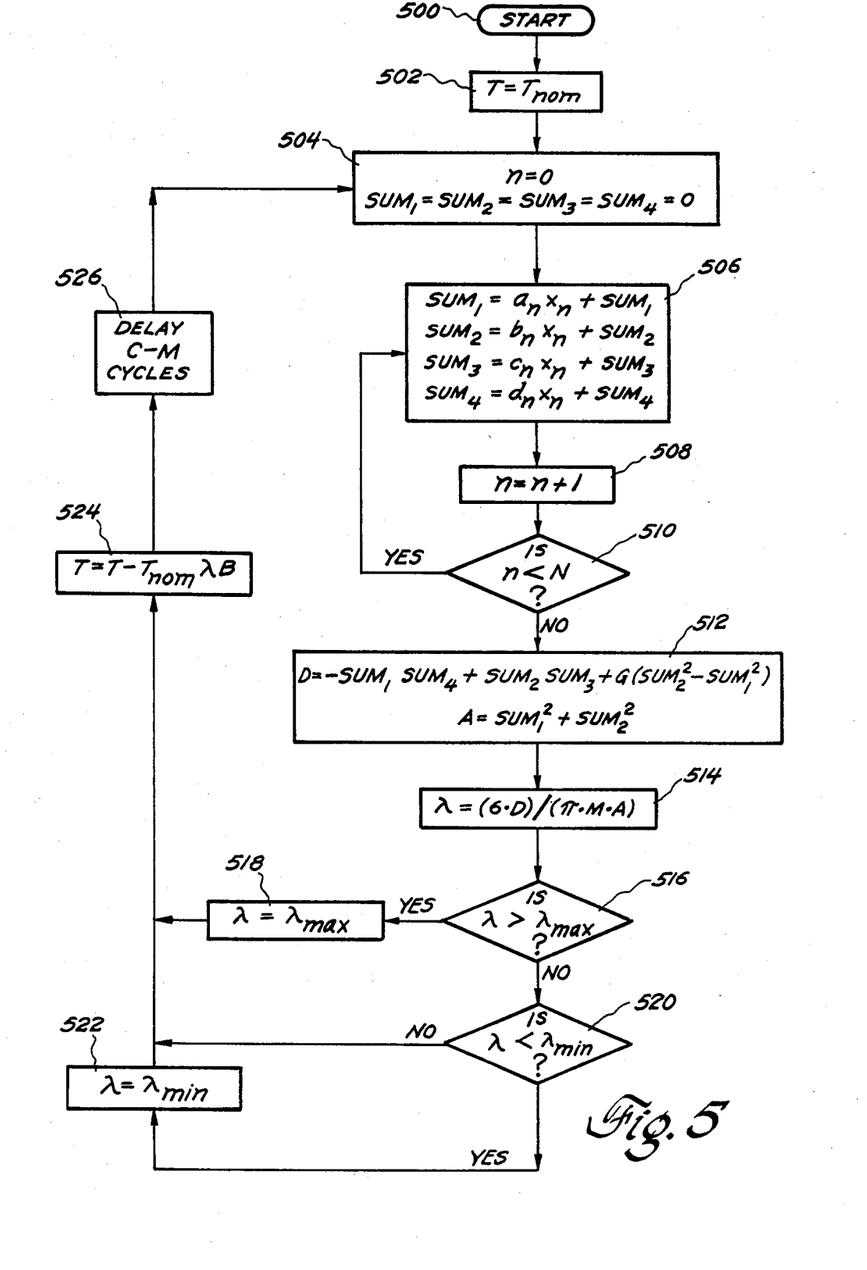
FIG. 5 is a decisional flow diagram illustrating the method which comprises the subject invention.

The general algorithm for performing the approximation to the optimal mean square estimation analysis of the present invention can be described more fully by referring to FIG. 5. Therein, a method for performing this analysis is illustrated, which method is particularly suitable for implementation using programmable signal processing devices such as microprocessor 202 of FIG. 2. The apparatus is initialized in step 500 wherein power is provided to the microprocessor of FIG. 2. During the initial step 502, a nominal frequency $T_{nom}$ is provided as the initial sampling frequency. The method begins with step 504 wherein an index variable n is initialized at zero and wherein four sum variables are also initialized at zero. After receiving the first data sample $x_n$, microprocessor 202 (FIG. 2) computes the first partial weighted sums, step 506, wherein the variables $a_n$, $b_n$, $c_n$ and $d_n$ are as defined hereinabove with reference to FIG. 3. It will be appreciated by those skilled in the art that after selecting the number of samples N and the number of cycles M over which these samples are to be chosen, the weighted variables $a_n$, $b_n$, $c_n$ and $d_n$ can each be precomputed and stored in a lookup table, thereby eliminating the need to recalculate these variables after receiving each data sample $x_n$, and further eliminating the need for recalculating these variables for each calculation.

After the partial sums are provided, microprocessor 202 increments the index variable n by 1, step 508, and then compares this variable to the number of desired samples N to determine whether the desired number of samples have been received, step 510. Where n is less than N, the desired number of data samples have not been received. Microprocessor 202 continues to calculate the four sum variables, step 506, until the results obtained from step 510 indicate receipt of the requisite number of samples.

After N data samples have been received, the microprocessor performs steps 512 and 514 to provide the frequency deviation value $\lambda$. It will be noted that if automatic gain control is provided, as described with reference to the embodiment of FIG. 4, $\lambda$ is computed in accordance with the formula described with reference to that Figure, which formula is not shown in step 514 of FIG. 5. After computing $\lambda$, microprocessor 202 compares $\lambda$ with a preselected maximum, step 516, and if $\lambda$ exceeds this maximum value, then $\lambda$ is set equal to $\lambda_{max}$, step 518. Similarly, $\lambda$ is compared to a preselected minimum $\lambda_{min}$, step 520, and if $\lambda$ is less than this minimum value, then $\lambda$ is set equal to $\lambda_{min}$, step 522. Hence, the effect of steps 516–522 is to provide limits on the allowable range of $\lambda$ in accordance with the following formula:

$$\lambda_{min} \leq \lambda \leq \lambda_{max},$$

where $\lambda_{min}$ and $\lambda_{max}$ are preselected constants. In the preferred embodiment, the limits on $\lambda$ are chosen as follows:
$\lambda_{min} = -0.2$, and
$\lambda_{max} = 0.2$, such that
$-0.2 \leq \lambda \leq 0.2$.

Because the solution to the optimal mean square estimation analysis discussed herein represents only an approximate solution, limits upon the range of $\lambda$ are necessary to insure the accuracy of the loop at the expense of speed in the transient response. It will be appreciated, however, by those skilled in the art that the approximate solution described herein provides the correct sign for the frequency deviation signal $\lambda$ even when $\lambda$ is determined to be beyond the acceptable range. Thus, although some speed is lost in the transient response for high frequency deviations, the method disclosed herein insures eventual frequency locking without uncontrolled oscillations, or "searching", as it is known in the art.

After providing $\lambda$ and correctly limiting the same, the actual sampling period T is recalculated, step 524. Microprocessor 202 is then available to perform other functions while delaying for the remaining C-M cycles, step 526, before returning to step 504 to perform another frequency deviation calculation.

As mentioned hereinabove, the period T which microprocessor 202 provides in step 524 is the staggered period providing the nominal period $T_{nom}$ provided in step 502 is the nominal period for the chosen rate of staggering. Further, it will be appreciated that the method as described herein will lock a sampling signal to an input signal with data representing only one cycle of the input.

While only several preferred embodiments of my novel method and apparatus for phase locking an output signal to an input signal using staggered samples have been presented in detail herein, many modifications and variations will now become apparent to those skilled in the art. It is my intent, therefore, to be limited only by the scope of the appended claims and not by the specific details presented herein.

What is claimed is:

1. A method for providing a sampling signal having a first frequency corresponding to a first period wherein said first frequency is maintained in substantially constant proportion to a second frequency of an input signal, said method comprising the steps of:

(a) sampling said input signal at instants determined by said sampling signal to provide a plurality of data signals wherein each said data signal represents the magnitude of said input signal at the sampling instant;

(b) performing an approximation to the optimal mean square estimation analysis on said data values to minimize the sum of the squares of the errors between said data values and assumed values with respect to phase angle, amplitude and frequency to thereby provide a frequency deviation signal which is indicative of the frequency difference between said first and second frequencies; and (c) modulating said first period in response to said frequency deviation signal such that said frequency deviation signal is minimized and, therefore, said first frequency is maintained in substantially constant proportion to said second frequency.

2. The method as recited in claim 1 wherein N of said data signals respectively designated $x_n$ for n=0 through N−1 are provided over M cycles of said input signal and wherein said step of performing an approximation to the optical mean square estimation analysis comprises the substeps of:

providing four weighted sums from said data signals in accordance with the following expressions:

$$SUM_1 = \sum_{n=0}^{N-1} a_n x_n;$$

$$SUM_2 = \sum_{n=0}^{N-1} b_n x_n;$$

$$SUM_3 = \sum_{n=0}^{N-1} c_n x_n; \text{ and}$$

$$SUM_4 = \sum_{n=0}^{N-1} d_n x_n;$$

wherein:
   $a_n = \cos[(2\pi M/N)(n+\frac{1}{2}-N/2)]$;
   $b_n = \sin[(2\pi M/N)(n+\frac{1}{2}-N/2)]$;
   $c_n = (a_n/N) \cdot (n+\frac{1}{2}-N/2)$; and
   $d_n = (b_n/N) \cdot (n+\frac{1}{2}-N/2)$;
   for $n = 0, 1, 2 \ldots (N-1)$;

providing a difference value and an amplitude value from said four weighted sums in accordance with the following expressions:

$$D = -SUM_1 SUM_4 + SUM_2 SUM_3 + G(SUM_2^2 - SUM_1^2),$$

$$A = (SUM_1^2 + SUM_2^2),$$

wherein:
   $G = 1/[2N \sin(2\pi/N)]$; and providing said frequency deviation signal in accordance with the follow expression:

$$\lambda = (6 \cdot D)/(\lambda \cdot M \cdot A).$$

3. The method as recited in claim 2 further including the step of placing maximum and minimum limitations on said frequency deviation signal in accordance with the following expression:

$$-0.2 \leq \lambda \leq 0.2,$$

such that said sampling period is modulated with a deviation signal within this range.

4. The method as recited in claim 1 wherein N of said data signals respectively designated $x_n$ for $n=0$ through $N-1$ are provided over M cycles of said input signal and wherein said step of performing an approximation to the optimal mean square estimation analysis comprises the substeps of:
providing four weighted sums from said data signals in accordance with the following expressions:

$$SUM_1 = \sum_{n=0}^{N-1} a_n x_n;$$

$$SUM_2 = \sum_{n=0}^{N-1} b_n x_n;$$

$$SUM_3 = \sum_{n=0}^{N-1} c_n x_n; \text{ and}$$

$$SUM_4 = \sum_{n=0}^{N-1} d_n x_n;$$

wherein:
$a_n = \cos[(2\pi M/N)(n+\frac{1}{2}-N/2)];$
$b_n = \sin[(2\pi M/N)(n+\frac{1}{2}-N/2)];$
$c_n = (a_n/N) \cdot (n+\frac{1}{2}-N/2);$ and
$d_n = (b_n/N) \cdot (n+\frac{1}{2}-N/2);$
for $n = 0, 1, 2 \ldots (N-1);$
providing a difference value from said four weighted sums in accordance with the following expression:

$$D = -SUM_1 SUM_4 + SUM_2 SUM_3 + G(SUM_2{}^2 - SUM_1{}^2),$$

wherein:
$G = 1/[2N \sin(2\pi/N)];$
providing said frequency deviation signal in accordance with the follow expression:

$$\lambda = (6 \cdot D)/(\pi \cdot M \cdot I),$$

wherein
I is equal to a constant value;
said method further comprising the steps of:
providing an amplitude value in accordance with the following formula:

$$A = SUM_1{}^2 + SUM_2{}^2; \text{ and}$$

modulating the amplitude of said input signal in response to said amplitude value such that the amplitude of said input signal is maintained to equal said constant value I.

5. The method of claim 4 further comprising the step of placing maximum and minimum limitations on said frequency deviation signal in accordance with the following expression:

$$-0.2 \leq \lambda \leq 0.2,$$

such that said sampling period is modulated with a deviation signal within this range.

6. Apparatus for providing a sampling signal having a first frequency corresponding to a first period wherein said first frequency is maintained in substantially constant proportion to a second frequency of an input signal, said apparatus comprising:
(a) means for sampling said input signal at instants determined by said sampling signal to provide a plurality of data signals wherein each said data signal represents the magnitude of said input signal at the sampling instant; and
(b) signal processing means for performing an approximation to the optimal mean square estimation analysis on said data values to minimize the sum of the squares of the errors between said data values and assumed values with respect to phase angle, amplitude and frequency to thereby provide a frequency deviation signal which is indicative of the frequency difference between said first and second frequencies, said signal processing means being further adapted to provide said sampling signal and to modulate said first period in response to said frequency deviation signal such that said frequency deviation signal is minimized and, therefore, said first frequency is maintained in substantially constant proportion to said second frequency.

7. Apparatus as recited in claim 6 wherein N of said data signals respectively designated $x_n$ for $n=0$ through $N-1$ are provided over M cycles of said input signals and wherein said signal processing means is adapted to:
provide four weighted sums from said data signals in accordance with the following expressions:

$$SUM_1 = \sum_{n=0}^{N-1} a_n x_n;$$

$$SUM_2 = \sum_{n=0}^{N-1} b_n x_n;$$

$$SUM_3 = \sum_{n=0}^{N-1} c_n x_n; \text{ and}$$

$$SUM_4 = \sum_{n=0}^{N-1} d_n x_n;$$

wherein:
$a_n = \cos[(2\pi M/N)(n+\frac{1}{2}-N/2)];$
$b_n = \sin[(2\pi M/N)(n+\frac{1}{2}-N/2)];$
$c_n = (a_n/N) \cdot (n+\frac{1}{2}-N/2);$ and
$d_n = (b_n/N) \cdot (n+\frac{1}{2}-N/2);$
for $n = 0, 1, 2 \ldots (n-=1);$
provide a difference value and an amplitude value from said four weighted sums in accordance with the following expressions:

$$D = -SUM_1 SUM_4 + SUM_2 SUM_3 + G(SUM_2{}^2 - SUM_1{}^2),$$

$$A = (SUM_1{}^2 + SUM_2{}^2),$$

wherein:
$G = 1/[2N \sin(2\pi/N)];$ and provide said frequency deviation signal in accordance with the follow expression:

$$\lambda = (6 \cdot D)/(\pi \cdot M \cdot A),$$

to thereby perform the approximation to the optimal mean square estimation analysis.

8. Apparatus as recited in claim 7 wherein said signal processing means is further adapted to place maximum and minimum limitations on said frequency deviation signal in accordance with the following expression:

$$-0.2 \leq \lambda \leq 0.2,$$

such that said sampling period is modulated with a deviation signal within this range.

9. Apparatus as recited in claim 6 wherein N of said data signals respectively designated $x_n$ for $n=0$ through $N-1$ are provided over M cycles of said input signal and wherein said signal processing means is adapted to:
provide four weighted sums from said data signals in accordance with the following expressions:

$$SUM_1 = \sum_{n=0}^{N-1} a_n x_n;$$

$$SUM_2 = \sum_{n=0}^{N-1} b_n x_n;$$

$$SUM_3 = \sum_{n=0}^{N-1} c_n x_n; \text{ and}$$

$$SUM_4 = \sum_{n=0}^{N-1} d_n x_n;$$

wherein:

$a_n = \cos[(2\pi M/N)(n + \frac{1}{2} - N/2)];$
$b_n = \sin[(2\pi M/N)(n + \frac{1}{2} - N/2)];$
$c_n = (a_n/N) \cdot (n + \frac{1}{2} - N/2);$ and
$d_n = (b_n/N) \cdot (n + \frac{1}{2} - N/2);$
for $n = 0, 1, 2 \ldots (N-1);$
provide a difference value from said four weighted sums in accordance with the following expression:

$$D = -SUM_1 SUM_4 + SUM_2 SUM_3 + G(SUM_2{}^2 - SUM_1{}^2)$$

wherein:
$G = 1/[2N \sin(2\pi/N)];$
provide an amplitude value in accordance with the follow formula:

$$A = SUM_1{}^2 + SUM_2{}^2;$$

modulate the amplitude of said data signals in response to said amplitude value such that the amplitude of said input signal is maintained to equal a constant value I; and
provide said freuency deviation signal in accordance with the following expression:

$$\lambda = (6 \cdot D)/(\pi \cdot M \cdot I).$$

10. Apparatus as recited in claim 9 wherein said signal processing means is further adapted to place maximum and minimum limitations on said frequency deviation signal in accordance with the following expression:

$$-0.2 \leq \lambda \leq 0.2,$$

such that said sampling period is modulated with a deviation signal within this range.

* * * * *